(12) United States Patent
Patton et al.

(10) Patent No.: US 6,845,114 B2
(45) Date of Patent: Jan. 18, 2005

(54) ORGANIC LASER THAT IS ATTACHABLE TO AN EXTERNAL PUMP BEAM LIGHT SOURCE

(75) Inventors: David L. Patton, Webster, NY (US); Joseph A. Manico, Rochester, NY (US); Edward Covannon, Ontario, NY (US); John P. Spoonhower, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 28 days.

(21) Appl. No.: 10/272,546

(22) Filed: Oct. 16, 2002

(65) Prior Publication Data

US 2004/0076202 A1 Apr. 22, 2004

(51) Int. Cl.[7] .............................. H01S 3/14; H01S 3/20; H01S 3/03; H01S 3/09
(52) U.S. Cl. .............................. 372/39; 372/53; 372/69; 372/65; 372/68
(58) Field of Search ................................. 372/7, 39, 40, 372/45, 46, 50, 53, 54, 68, 69, 70, 71, 107, 65, 20, 9, 21, 22, 26, 29.011, 43, 99, 108; 257/40

(56) References Cited

U.S. PATENT DOCUMENTS

| | | | | |
|---|---|---|---|---|
| 4,849,036 A | * | 7/1989 | Powell et al. | 156/99 |
| 5,325,386 A | * | 6/1994 | Jewell et al. | 372/50 |
| 5,408,110 A | * | 4/1995 | Janz et al. | 257/97 |
| 5,867,324 A | * | 2/1999 | Kmetec et al. | 359/625 |
| 5,881,083 A | | 3/1999 | Diaz-Garcia et al. | |
| 5,881,089 A | | 3/1999 | Berggren et al. | |
| 6,160,828 A | * | 12/2000 | Kozlov et al. | 372/39 |
| 6,177,989 B1 | * | 1/2001 | Bruce | 356/237.5 |
| 6,194,119 B1 | | 2/2001 | Wolk et al. | |
| 6,370,168 B1 | * | 4/2002 | Spinelli | 372/22 |
| 6,553,051 B1 | * | 4/2003 | Tan et al. | 372/70 |
| 2003/0109142 A1 | * | 6/2003 | Cable et al. | 438/708 |

OTHER PUBLICATIONS

U.S. patent application Ser. No. 09/832,759, Kahen et al., filed Apr. 11, 2001.
U.S. patent application Ser. No. 10/066,829, Kahen, filed Feb. 4, 2002.
U.S. patent application Ser. No. 10/066,936, Kahen et al., filed Feb. 4, 2002.
Scott W. Corzine, et al., "Design of Fabry–Perot Surface–Emitting Lasers with a Periodic Gain Structure" IEEE Journal of Quantum Electronics, vol. 25, No. 6, Jun. 1989, pp. 1513–1524.
M. D. McGehee, et al., "Semiconducting polymer distributed feedback lasers" Applied Physics Letters, vol. 72, No. 13, Mar. 30, 1998, pp. 1536–1538.
Nir Tessler, et al., Advanced Materials, 1998, 10, No. 1, pp. 64–68.

(List continued on next page.)

*Primary Examiner*—Minsun Oh Harvey
*Assistant Examiner*—Armando Rodriguez
(74) *Attorney, Agent, or Firm*—Stephen H. Shaw

(57) ABSTRACT

A vertical cavity organic laser device, that includes: an organic laser cavity including: a bottom dielectric stack for receiving and transmitting pump beam light and being reflective to laser light over a predetermined range of wavelengths; an organic active region for receiving transmitted pump beam light from the bottom dielectric stack and for emitting the laser light; a top dielectric stack for reflecting transmitted pump beam light and laser light from the organic active region back into the organic active region, wherein a combination of the bottom and the top dielectric stacks and the organic active region produces the laser light; the device further including an external pump beam light source for optically pumping light to the organic laser cavity; and a positioner for locating the organic laser cavity in a spaced relationship to the external pump beam light source.

38 Claims, 15 Drawing Sheets

OTHER PUBLICATIONS

M. Berggren, et al., "letters to nature" Nature, vol. 389, Oct. 2, 1997, pp. 466–469.

N. Tessler, et al., "Pulsed excitation of low–mobility light–emitting diodes: Implication for organic lasers" Applied Physics Letters, vol. 74, No. 19, May 10, 1999, pp. 2764–2766.

Susumu Kinoshita, et al., "Circular Buried Heterostructure (CBH) GaAlAs/GaAs Surface Emitting Lasers" IEEE Journal of Quantum Electronics, vol. QE–23, No. 6, Jun. 1987, pp. 882–888.

Kent D. Choquette, et al., "Vertical–Cavity Surface Emitting Lasers: Moving from Research to Manufacturing" Proceedings of the IEEE, vol. 85, No. 11, Nov. 1997, pp. 1730–1739.

Carl W. Wilmsen, et al., "Vertical–Cavity Surface–Emitting Lasers" Cambridge University Press.

T. Ishigure, et al., "2.5 Gbit/s 100m data transmission using graded–index polymer optical fibre and highspeed laser diode at 650nm wavelength" Electronics Letters, Mar. 16, 1995, vol. 31, No. 6, pp. 467–469.

V. G. Kozlov, et al., "Study of lasing action based on Forster energy transfer in optically pumped organic semiconductor thin films" Journal of Applied Physics, vol. 84, No. 8, Oct. 15, 1998, pp. 4096–4106.

G. Kranzelbinder, et al., "Organic solid–state lasers" Rep. Prog. Phys. 63 (2000) pp. 729–762.

* cited by examiner

ORGANIC LASER THAT IS ATTACHABLE TO AN EXTERNAL PUMP BEAM LIGHT SOURCE

CROSS-REFERENCE TO RELATED APPLICATIONS

Reference is made to commonly assigned U.S. patent application Ser. No. 09/832,759 filed Apr. 11, 2001 entitled "Incoherent Light-Emitting Device Apparatus for Driving Vertical Laser Cavity" by Keith B. Kahen et al.; commonly assigned U.S. patent application Ser. No. 10/066,936 filed Feb. 04, 2002 entitled "Organic Vertical Cavity Lasing Devices Containing Periodic Gain Regions" by Keith B. Kahen et al.; and commonly assigned U.S. patent application Ser. No. 10/066,829 filed Feb. 4, 2002 entitled "Organic Vertical Cavity Phase-Locked Laser Array Device" by Keith B. Kahen, the disclosures of which are incorporated herein by reference.

FIELD OF THE INVENTION

The invention relates generally to the field of organic lasers, and in particular to vertical cavity organic lasers, herein also termed organic laser cavity devices. More specifically, the invention relates to positioning an organic laser cavity device in a spaced relationship relative to an external pumped-beam light source.

BACKGROUND OF THE INVENTION

Vertical cavity surface emitting lasers (VCSELs) based on inorganic semiconductors (e.g. AlGaAs) have been developed since the mid-80's (S. Kinoshita et al., IEEE Journal of Quantum Electronics, Vol. QE-23, No. 6, June 1987). They have reached the point where AlGaAs-based VCSELs emitting at 850 nm are manufactured by a number of companies and have lifetimes beyond 100 years (K. D. Choquette et al., Proceedings of the IEEE, Vol. 85, No. 11, November 1997). With the success of these near-infrared lasers, attention in recent years has turned to other inorganic material systems to produce VCSELs capable of emitting in the visible wavelength range (C. Wilmsen et al., *Vertical-Cavity Surface-Emitting Lasers*, Cambridge University Press, Cambridge, 2001). There are many potential applications for visible lasers, such as, displays, optical storage reading and writing, laser printing, and short-haul telecommunications employing plastic optical fibers (T. Ishigure et al., Electronics Letters, Vol. 31, No. 6, Mar. 16, 1995). In spite of the worldwide efforts of many industrial and academic laboratories, much work remains to create viable laser diodes (either edge emitters or VCSELs) capable of producing light output that spans the visible spectrum.

In an effort to produce visible wavelength VCSELs, it would be advantageous to abandon inorganic-based systems and focus on organic-based laser systems; since organic-based gain materials can enjoy a number of advantages over inorganic-based gain materials in the visible spectrum. For example, typical organic-based gain materials have the properties of low unpumped scattering/absorption losses and high quantum efficiencies. In comparison to inorganic laser systems, organic lasers are relatively inexpensive to manufacture, can emit over the entire visible range, can be scaled to arbitrary size, and most importantly, are able to emit multiple wavelengths (such as red, green, and blue) from a single chip. Over the past number of years, there has been increasing interest in making organic-based solid-state lasers. The laser gain material has been either polymeric or small molecule and a number of different resonant cavity structures were employed, such as, microcavity (Kozlov et al., U.S. Pat. No. 6,160,828 issued Dec. 12, 2000), wave guide, ring microlasers, and distributed feedback (see also, for instance, G. Kranzelbinder et al., Rep. Prog. Phys. 63, 2000, and Diaz-Garcia et al., U.S. Pat. No. 5,881,083 issued Mar. 9, 1999). A problem with all of these structures is that in order to achieve lasing it was necessary to excite the cavities by optical pumping using another laser source. It is much preferred to electrically pump the laser cavities since this generally results in more compact and easier to modulate structures.

A main barrier to achieving electrically pumped organic lasers is the small carrier mobility of organic material, which is typically on the order of $10^{-5}$ cm$^2$/(V-s). This low carrier mobility results in a number of problems. Devices with low carrier mobilities are typically restricted to using thin layers in order to avoid large voltage drops and ohmic heating. These thin layers result in the lasing mode penetrating into the lossy cathode and anode, which causes a large increase in the lasing threshold (V. G. Kozlov et al., Journal of Applied Physics, Vol. 84, No. 8, Oct. 15, 1998). Since electron-hole recombination in organic materials is governed by Langevin recombination (whose rate scales as the carrier mobility), low carrier mobilities result in orders of magnitude having more charge carriers than singlet excitations; one of the consequences of this is that charge-induced (polaron) absorption can become a significant loss mechanism (N. Tessler et al., Applied Physics Letters, Vol. 74, No. 19, May 10, 1999). Assuming laser devices have a 5% internal quantum efficiency, using the lowest reported lasing threshold to date of ~100 W/cm$^2$ (M. Berggren et al., Letters To Nature, Vol. 389, Oct. 2, 1997), and ignoring the above mentioned loss mechanisms, would put a lower limit on the electrically-pumped lasing threshold of 1000 A/cm$^2$. Including these loss mechanisms would place the lasing threshold well above 1000 A/cm$^2$, which to date is the highest reported current density, which can be supported by organic devices (N. Tessler, Advanced Materials 1998, 10, No. 1).

An alternative to electrical pumping for organic lasers is optical pumping by incoherent light sources, such as, light emitting diodes (LEDs), either inorganic (M. D. McGehee et al. Applied Physics Letters, Vol. 72, No. 13, Mar. 30, 1998) or organic (Berggren et al., U.S. Pat. No. 5,881,089 issued Mar. 9, 1999). This possibility is the result of unpumped organic laser systems having greatly reduced combined scattering and absorption losses (~0.5 cm$^{-1}$) at the lasing wavelength, especially when one employs a host-dopant combination as the active media. Even taking advantage of these small losses, the smallest reported optically pumped threshold for organic lasers to date is 100 W/cm$^2$ based on a wave guide laser design (M. Berggren et al., Letters To Nature Vol. 389, Oct. 2, 1997). Since off-the-shelf inorganic LEDs can only provide up to ~20 W/cm$^2$ of power density, it is necessary to take a different route to avail of optically pumping by incoherent sources. Additionally, in order to lower the lasing threshold, it is necessary to choose a laser structure, which minimizes the gain volume; a VCSEL-based organic microcavity laser satisfies this criterion. Using VCSEL-based organic laser cavities should enable optically pumped power density thresholds below 5 W/cm$^2$. As a result practical organic laser devices can be driven by optically pumping them with a variety of readily available, incoherent light sources, such as LEDs.

A disadvantage to the above described use of LEDs as an optical pumping means is that the LEDs are incorporated as an integral part of the organic cavity laser device. Therefore, the LED alignment is difficult to accomplish and not readily changeable, if aligned incorrectly.

What is needed is a convenient way of attaching and dynamically aligning an organic cavity laser device to an incoherent light source.

SUMMARY OF THE INVENTION

The present invention is directed to overcoming one or more of the problems by providing an a vertical cavity organic laser device, that includes: an organic laser cavity including: a bottom dielectric stack for receiving and transmitting pump beam light and being reflective to laser light over a predetermined range of wavelengths; an organic active region for receiving transmitted pump beam light from the first dielectric stack and for emitting the laser light; and a top dielectric stack for reflecting transmitted pump beam light and the laser light from the organic active region back into the organic active region, wherein a combination of the bottom and the top dielectric stacks and the organic active region produces the laser light; the device further including an external pump beam light source for optically pumping light to the organic laser cavity; and a positioner for locating the organic laser cavity in a spaced relationship to the external pump beam light source.

Another embodiment of the present invention provides a method for directing pump beam light to at least one vertical cavity organic laser device; that includes the steps of: selecting a spaced relationship between an external pump beam light source and the at least one vertical cavity organic laser device; and positioning the external pump beam light source and the at least one vertical cavity organic laser device such that light rays are directed from the external pump beam light source to the at least one vertical cavity organic laser device.

ADVANTAGEOUS EFFECT OF THE INVENTION

One advantage of the organic laser cavity devices is that they have a low lasing threshold, which allows great flexibility in choosing a pump light source, and in the spaced relationship of the pump light source to the organic laser cavity device. A second advantage is that the present invention provides a convenient way of attaching and dynamically aligning an organic cavity laser device to an incoherent light source

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

To facilitate understanding, identical reference numerals have been used, where possible, to designate identical elements that are common to the figures.

DETAILED DESCRIPTION OF THE INVENTION

In the present invention, the terminology describing vertical cavity organic laser devices (VCSELs) may be used interchangeably in a short hand fashion as "organic laser cavity devices." Organic laser cavity structures are fabricated as large area structures and optically pumped with light emitting diodes (LEDs).

Figure 1:
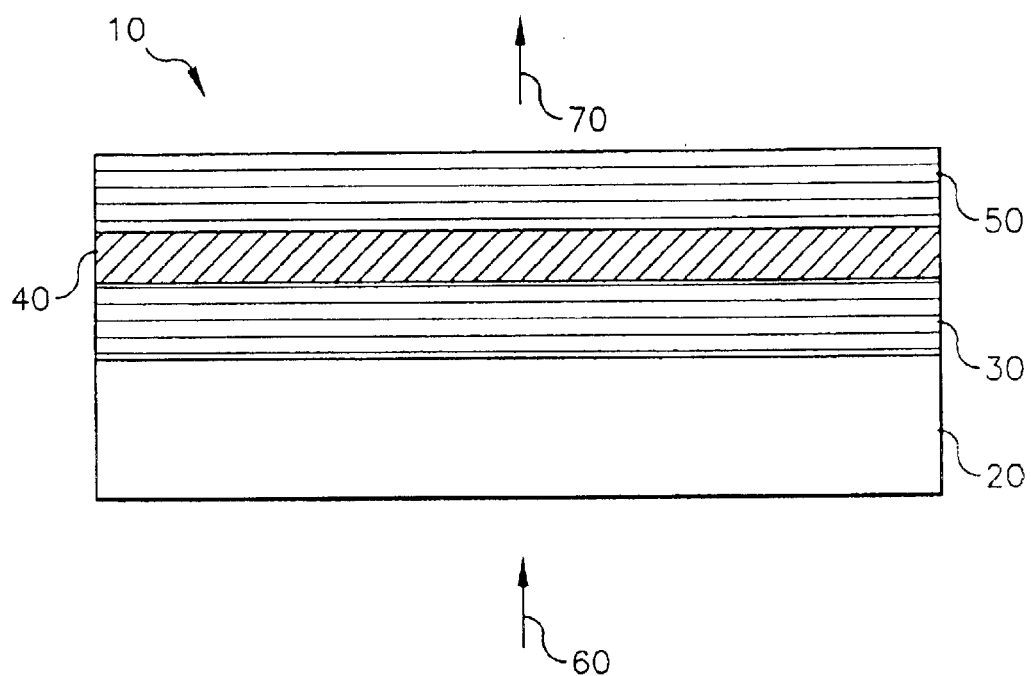
FIG. 1 is a schematic cross-section view of a vertical cavity organic laser device made in accordance with the present invention.

A schematic of a vertical cavity organic laser device 10 is shown in FIG. 1. The substrate 20 can either be light transmissive or opaque, depending on the intended direction of optical pumping and laser emission. Light transmissive substrates 20 may be transparent glass, plastic, or other transparent materials such as sapphire. Alternatively, opaque substrates including, but not limited to, semiconductor material (e.g. silicon) or ceramic material may be used in the case where both optical pumping and emission occur through the same surface. On the substrate is deposited a bottom dielectric stack 30 followed by an organic active region 40. A top dielectric stack 50 is then deposited. A pump beam 60 optically pumps the vertical cavity organic laser device 10. The source of the pump beam 60 may be incoherent, such as emission from a light-emitting diode (LED). Alternatively, the pump beam 60 may originate from a coherent laser source. The figure shows laser emission 70 from the top dielectric stack 50. Alternatively, the laser device could be optically pumped through the top dielectric stack 50 with the laser emission through the substrate 20 by proper design of the dielectric stack reflectivities. In the case of an opaque substrate, such as silicon, both optical pumping and laser emission occur through the top dielectric stack 50.

The preferred material for the organic active region 40 is a small-molecular weight organic host-dopant combination, typically, deposited by high-vacuum thermal evaporation. These host-dopant combinations are advantageous since they result in very small unpumped scattering/absorption losses for the gain media. It is preferred that the organic molecules be of small molecular weight since vacuum deposited materials can be deposited more uniformly than spin-coated polymeric materials. It is also preferred that the host materials used in the present invention are selected such that they have sufficient absorption of the pump beam 60 and are able to transfer a large percentage of their excitation energy to a dopant material via Förster energy transfer. Those skilled in the art are familiar with the concept of Förster energy transfer, which involves a radiationless transfer of energy between the host and dopant molecules. An example of a useful host-dopant combination for red-emitting lasers is aluminum tris (8-hydroxyquinoline) (Alq) as the host and [4-(dicyanomethylene)-2-t-butyl-6-(1,1,7,7-tetramethyljulolidyl-9-enyl)-4H-pyran] (DCJTB) as the dopant (at a volume fraction of 1%). Other host-dopant combinations can be used for other wavelength emissions. For example, in the green a useful combination is Alq as the host and [10-(2-benzothiazolyl)-2,3,6,7-tetrahydro-1,1,7,7-tetramethyl-1H,5H,11H-[1]Benzopyrano[6,7,8-ij]quinolizin-11-one] (C545T) as the dopant (at a volume fraction of 0.5%). Other organic gain region materials can be polymeric substances, e.g., polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 issued Feb. 27, 2001, and referenced herein. It is the purpose of the organic active region 40 to receive transmitted pump beam light 60 and emit laser light.

The bottom and top dielectric stacks 30 and 50, respectively, are preferably deposited by conventional electron-beam deposition and can comprise alternating high index and low index dielectric materials, such as, $TiO_2$ and $SiO_2$, respectively. Other materials, such as $Ta_2O_5$ for the high index layers, could be used. The bottom dielectric stack 30 is deposited at a temperature of approximately 240° C. During the top dielectric stack 50 deposition process, the temperature is maintained at around 70° C. to avoid melting the organic active materials. In an alternative embodiment of the present invention, the top dielectric stack is replaced by the deposition of a reflective metal mirror layer. Typical metals are silver or aluminum, which have reflectivities in excess of 90%. In this alternative embodiment, both the pump beam 60 and the laser emission 70 would proceed through the substrate 20. Both the bottom dielectric stack 30 and the top dielectric stack 50 are reflective to laser light over a predetermined range of wavelengths, in accordance with the desired emission wavelength of the laser cavity 10.

The use of a vertical microcavity with very high finesse allows a lasing transition at a very low threshold (below 0.1 $W/cm^2$ power density). This low threshold enables incoherent optical sources to be used for the pumping instead of the focused output of laser diodes, which is conventionally used in other laser systems. An example of a pump source is a UV LED, or an array of UV LEDs, e.g. from Cree (specifically, the XBRIGHT® 900 Ultraviolet Power Chip® LEDs). These sources emit light centered near 405 nm wavelength and are known to produce power densities on the order of 20 $W/cm^2$ in chip form. Thus, even taking into account limitations in utilization efficiency due to device packaging and the extended angular emission profile of the LEDs, the LED brightness is sufficient to pump the laser cavity at a level many times above the lasing threshold.

Figure 2:
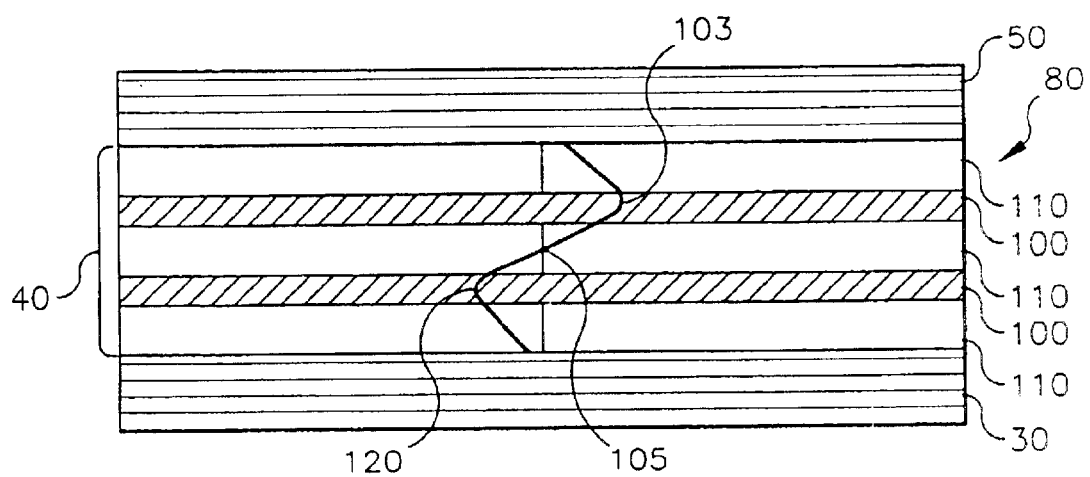
FIG. 2 is a schematic cross-section view of another embodiment of a vertical cavity organic laser device made in accordance with the present invention.

The efficiency of the laser is improved further using an active region design as depicted in FIG. 2 for the vertical cavity organic laser device 80. The organic active region 40 includes one or more periodic gain regions 100 and organic spacer layers 110 disposed on either side of the periodic gain regions and arranged so that the periodic gain regions are aligned with antinodes 103 of the device's standing wave electromagnetic field 120. This is illustrated in FIG. 2 where the laser's standing electromagnetic field pattern 120 in the organic active region 40 is schematically drawn. Since stimulated emission is highest at the antinodes 103 and negligible at the nodes 105 of the electromagnetic field, it is inherently advantageous to form the active region 40 as shown in FIG. 2. The organic spacer layers 110 do not undergo stimulated or spontaneous emission and largely do not absorb either the laser emission 70 or the pump beam 60 wavelengths. An example of an organic spacer layer 110 is the organic material 1,1-Bis-(4-bis(4-methyl-phenyl)-amino-phenyl)-cyclohexane (TAPC). TAPC works well as the spacer material since it largely does not absorb either the laser emission 70 or the pump beam 60 energy and, in addition, its refractive index is slightly lower than that of most organic host materials. This refractive index difference is useful since it helps in maximizing the overlap between the electromagnetic field antinodes 103 and the periodic gain region(s) 100. As will be discussed below with reference to the present invention, employing periodic gain region(s) 100 instead of a bulk gain region results in higher power conversion efficiencies and a significant reduction of the unwanted spontaneous emission. The placement of the periodic gain region(s) 100 is determined by using the standard matrix method of optics (S. Corzine et al., IEEE Journal of Quantum Electronics, Vol. 25, No. 6, June 1989). To get good results, the thicknesses of the periodic gain region(s) 100 need to be at or below 50 nm in order to avoid unwanted spontaneous emission.

Figure 3:
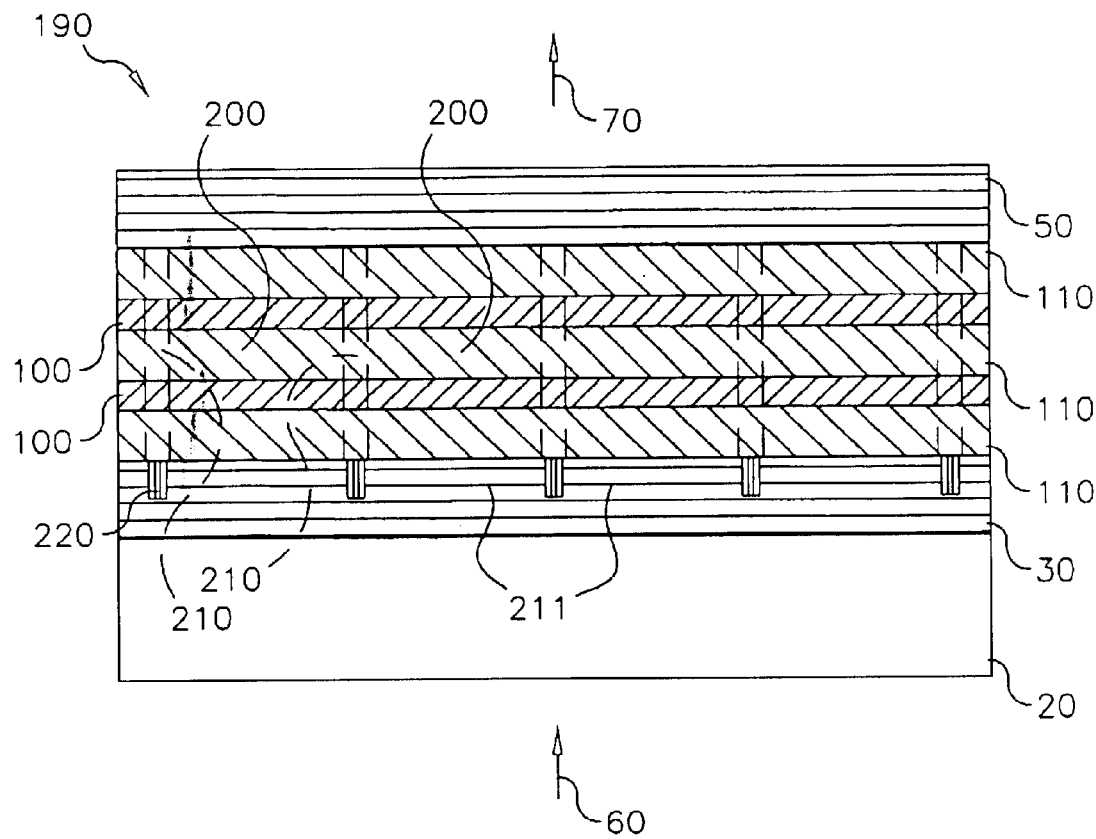
FIG. 3 is a schematic cross-section view of a phase-locked organic laser array.

The laser can be increased in area while maintaining a degree of spatial coherence by utilizing the phase-locked organic laser array device 190 as depicted in FIG. 3. In order to form a two-dimensional phase-locked organic laser array device 190, organic laser cavity devices 200 separated by inter-pixel regions 210 need to be defined on the surface of the VCSEL. To obtain phase locking, intensity and phase information must be exchanged amongst the organic laser cavity devices 200. This is best obtained by weakly confining the laser emissions to the pixel regions by either small amounts of built-in index or gain guiding, e.g. by modulating the reflectance of one of the mirrors. In one embodiment, the reflectance modulation was affected by patterning and forming an etched region 220 in the bottom dielectric stack 30, using standard photolithographic and etching techniques, thus forming a two-dimensional array of circular pillars 211 on the surface of the bottom dielectric stack 30. The remainder of the organic laser microcavity structure is deposited upon the patterned bottom dielectric stack 30 as described above. In one embodiment, the shape of the laser pixels is circular; however, other pixel shapes are possible, such as rectangular, for example. The inter-pixel regions 210 is in the range of 0.25 to 4 μm. Phase-locked array operation also occurs for larger inter-pixel regions 210; however, it leads to inefficient usage of the optical-pumping energy. The etch depth is preferred to be from 200 to 1000 nm deep to form etched region 220. By etching just beyond an odd number of layers into the bottom dielectric stack 30, it is possible to affect a significant shift of the longitudinal mode wavelength in the etched region away from the peak of the gain media. Hence, lasing action is prevented and spontaneous emission is significantly reduced in the inter-pixel regions 210. The end result of the formation of etched region 220 is that the laser emission is weakly confined to the organic laser cavity devices 200, no lasing originates from the inter-pixel regions 210, and coherent phase-locked laser light is emitted by the array 190.

One other advantage of the organic VCSEL devices, also herein referred to as organic laser cavity devices and used interchangeably, is that they can be easily fabricated into arrays of individually-addressable elements. In such arrays, each element would be incoherent with neighboring elements and pumped by a separate pump source (e.g. LED or group of LEDs). The arrays could either be one-dimensional (linear) or two-dimensional (area) depending on the requirements of the application. The elements in the array can also comprise multiple host-donor combinations and/or multiple cavity designs such that a number of wavelengths could be produced by a single array.

Figure 4A:
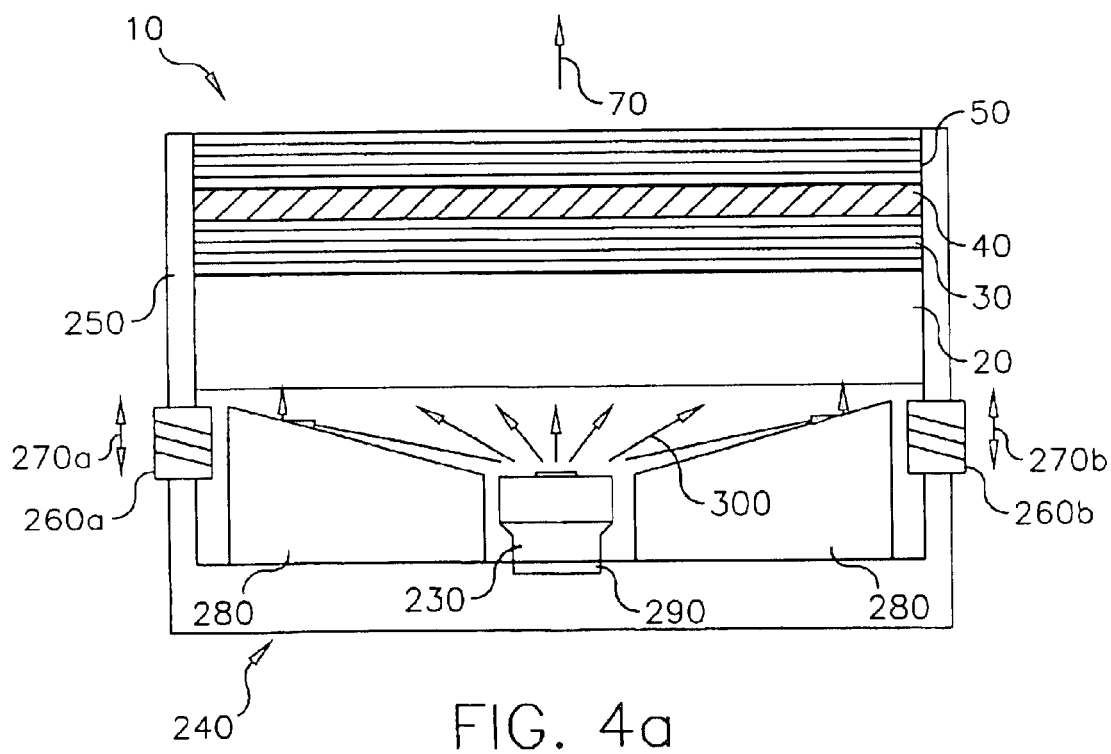
FIG. 4a is a schematic cross-section view of the vertical cavity organic laser device with a positioner attached made in accordance with the present invention.

FIG. 4a illustrates a cross-sectional view of the vertical cavity organic laser device 10 and pump beam light source 230 held in place by a positioner 240. The positioner 240 comprises a framework 250 for holding the pump beam light source 230 in a spaced relationship to the vertical cavity organic laser device 10. The optimum spaced relationship between the vertical cavity organic laser device 10 and the pump beam light source 230 is maintained by use of adjusters 260a and 260b. The adjusters 260a and 260b may be piezo chips or very fine thread screws and are capable of moving the vertical cavity organic laser device 10 in the direction shown by arrows 270a and 270b. The positioner 240 further comprises a pump beam light cone 280, which directs the light rays 300 from the pump beam light source 230 to the vertical cavity organic laser device 10 and a pump beam light source holder 290. (Pump beam light cone 280 is generally a light gathering mechanism which could be a reflector.) In the embodiment shown in FIG. 4a, the pump beam light source 230 is a CREE MegaBright™ LED.

One of the advantages of the vertical cavity organic laser device 10 is the ability to specify the vertical cavity organic laser device 10 to emit at a very narrow wavelength of light $\lambda_1$. It is advantageous to be able to dynamically shift the output of the vertical cavity organic laser device 10 from one specific wavelength of light $\lambda_1$ to another specific wavelength of light $\lambda_2$.

Figure 4B:
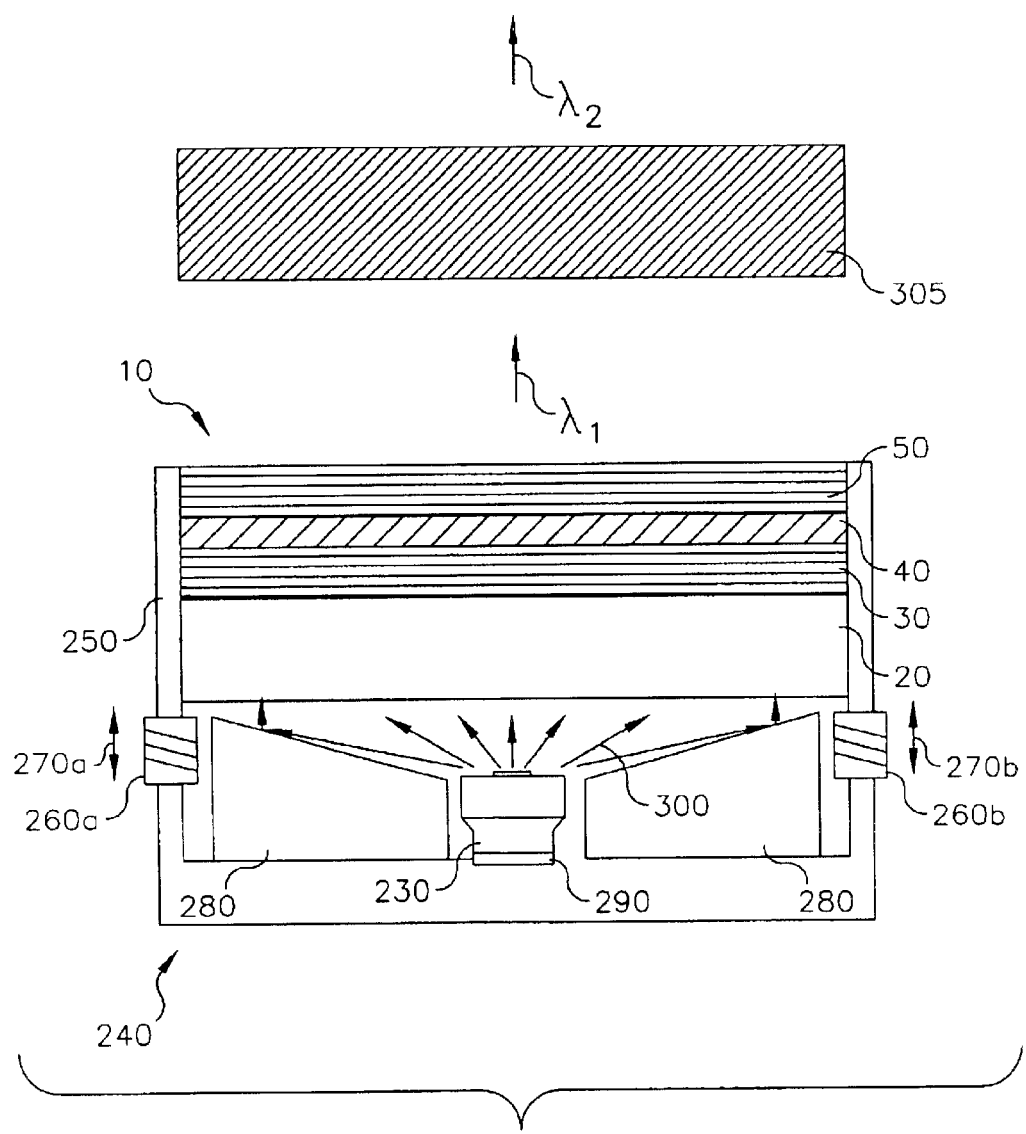
FIG. 4b is a schematic cross-section view of the vertical cavity organic laser device with second harmonic frequency generator made in accordance with the present invention.

Referring now to FIG. 4b, one technique for dynamically shifting the output of the vertical cavity organic laser device 10 is non-linear frequency mixing, for example, second harmonic generation. The emission $\lambda_1$ from a first vertical cavity organic laser device 10 is directed into a second harmonic frequency generator 305. The second harmonic frequency generator 305 is comprised of a material such as lithium niobate (LiNbO$_3$). The second harmonic frequency generator 305 either doubles the frequency or halves the wavelength as defined by the equation: $\lambda_2 = \lambda_1/2$.

Figure 4C:
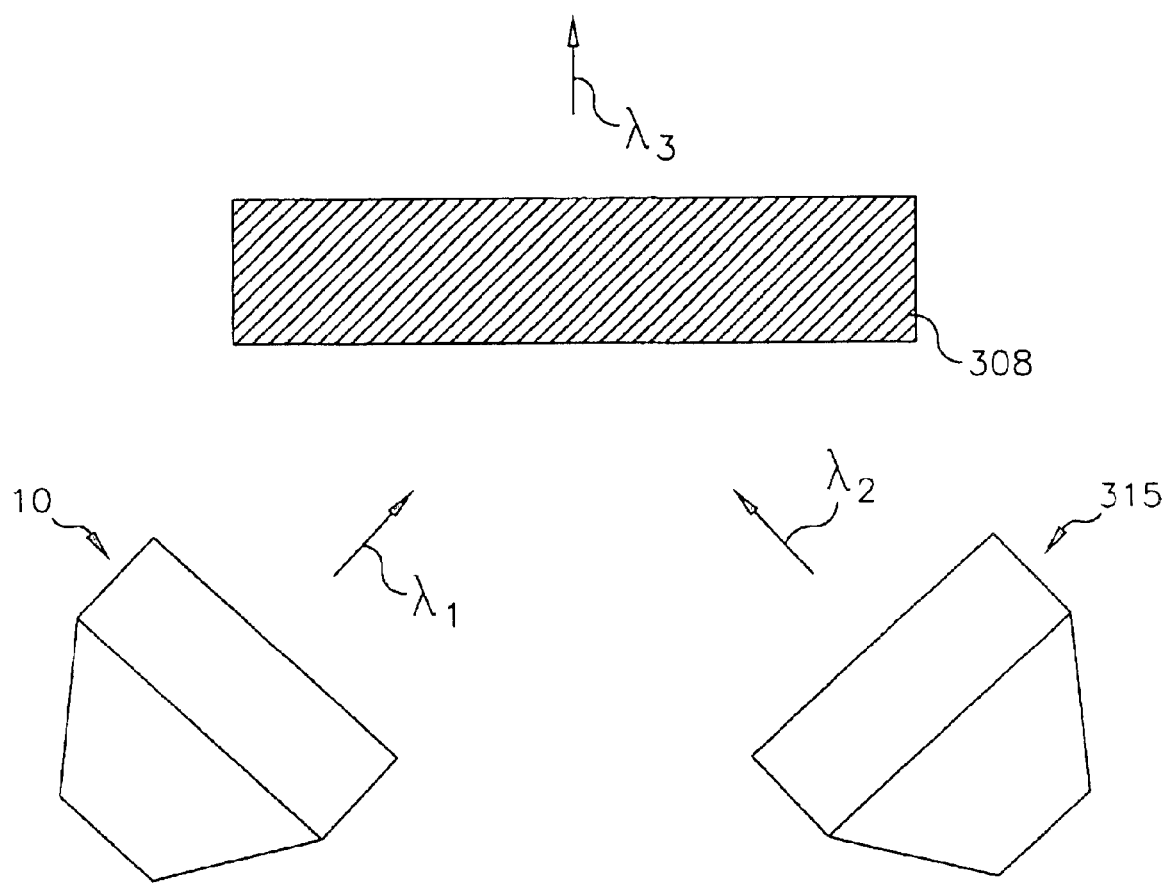
FIG. 4c is a schematic cross-section view of the vertical cavity organic laser device with sum or difference frequency generator made in accordance with the present invention.

FIG. 4c illustrates another technique for dynamically shifting the output of the vertical cavity organic laser device 10. The emission $\lambda_1$ from the vertical cavity organic laser device 10 is directed into a sum or difference frequency generator 308, while the emission $\lambda_2$ from a second vertical cavity organic laser device 315 is also directed into the sum or difference frequency generator 308. The sum or difference frequency generator 308 either adds or subtracts the frequencies as defined by the equation: $\lambda_3 = \lambda_1 + \text{or} - \lambda_2$. The sum or difference frequency generator 308 is comprised of a material such as lithium niobate (LiNbO$_3$).

Figure 5:
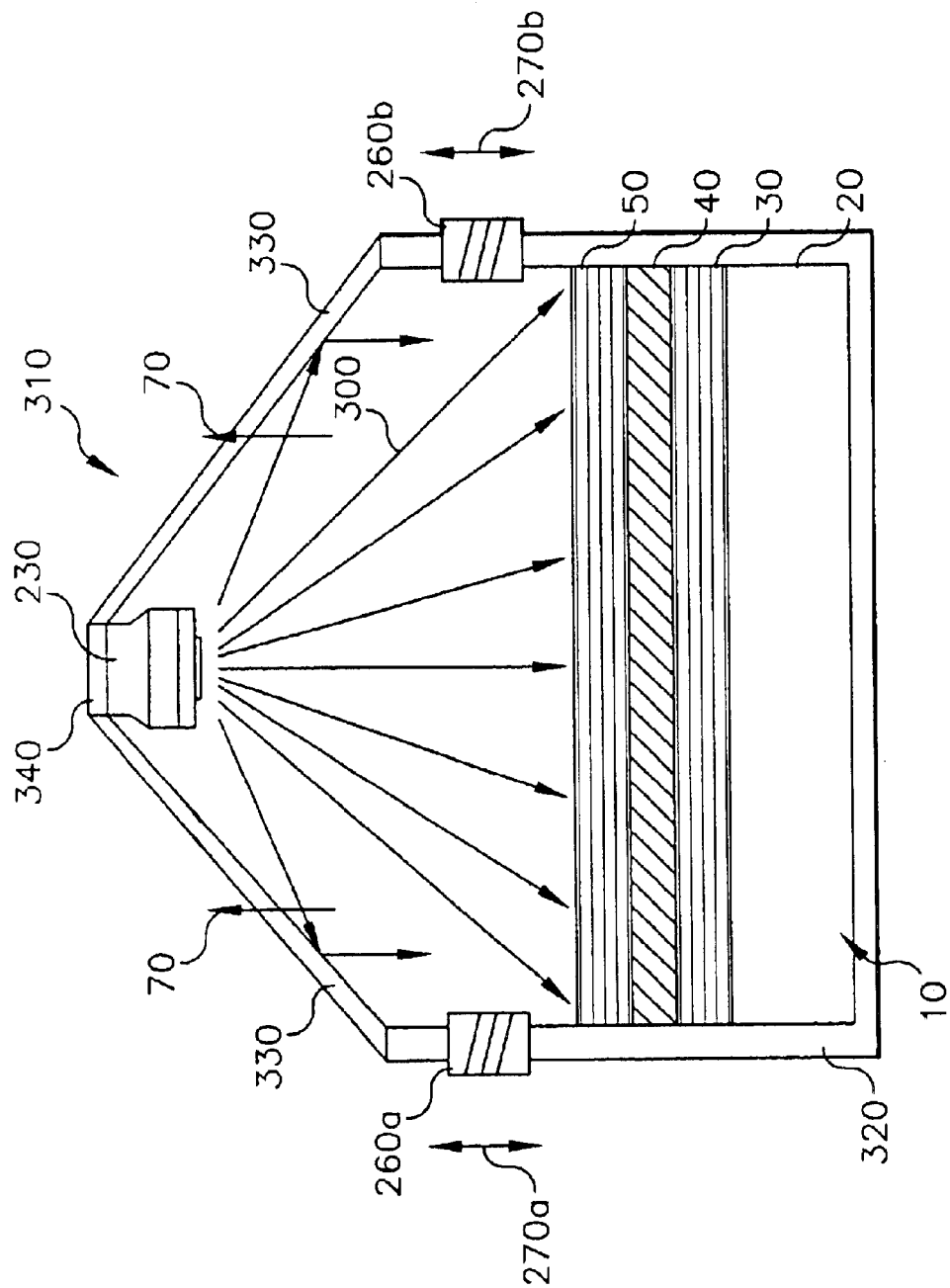
FIG. 5 is a schematic cross-section view of another embodiment of the vertical cavity organic laser device and positioner made in accordance with the present invention.

FIG. 5 is a schematic cross-section view of another embodiment of the vertical cavity organic laser device 10 and pump beam light source 230 both held in place by a positioner 310 made in accordance with the present invention. As previously discussed in FIG. 4a, like numerals indicate like parts and operations. In the embodiment illustrated, the optical path through the vertical cavity organic laser device 10 is inverted so the vertical cavity organic laser device 10 is optically pumped through the top dielectric stack 50 with the laser emission reflected from the bottom dielectric stack 30 and substrate 20. In this alternative embodiment, the bottom dielectric stack 30 reflects both the pump beam light rays 300 and the laser emission 70. Both the bottom dielectric stack 30 and the top dielectric stack 50 are reflective to laser light over a predetermined range of wavelengths, in accordance with the desired emission wavelength of the vertical cavity organic laser device 10. The top dielectric stack 50 must be transmissive to the pump beam wavelength. The positioner 310 comprises a framework 320 for holding the pump beam light source 230 in a spaced relationship to the vertical cavity organic laser device 10. The optimum spaced relationship between the vertical cavity organic laser device 10 and the pump beam light source 230 is maintained by use of adjusters 260a and 260b. The adjusters 260a and 260b may be piezo chips or very fine thread screws and are capable of moving the vertical cavity organic laser device 10 in the direction shown by arrows 270a and 270b. The positioner 310 further comprises a pump beam light cone 330, which directs the light rays 300 from the pump beam light source 230 to the vertical cavity organic laser device 10 and allows the laser emission 70 to pass through. The pump beam light cone 330 directs the pump beam light rays 300 toward the vertical cavity organic laser device 10 while allowing the laser emission 70 to pass through. The pump beam light cone 330 may be comprised of an optical filter material which reflects the pump beam wavelength and transmits the laser emission 70. Such filters are typically constructed by deposition of multiple layers of dielectric materials. The availability of such filters is well known to those skilled in the art. The positioner 310 further comprises a pump beam light source holder 340.

Figure 6:
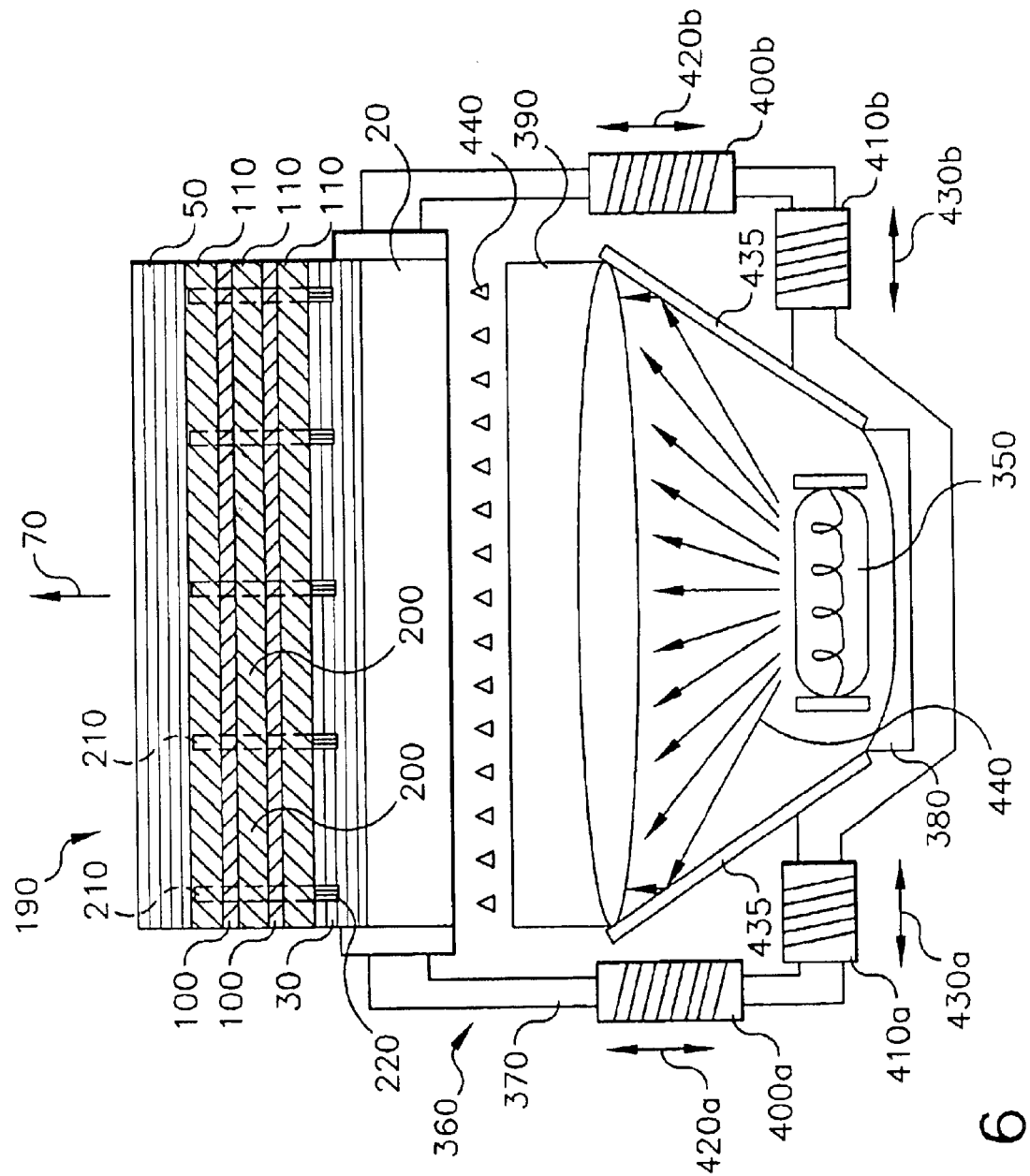
FIG. 6 is a schematic cross-section view of the vertical cavity organic laser array and positioner made in accordance with the present invention.

FIG. 6 is a schematic cross-section view of a vertical cavity organic laser array 190 held in a spaced relationship to the external pump beam light source 350 by the positioner 360. The positioner 360 comprises a framework 370 for holding the external pump beam light source 350, a reflector 380 and a collimating optic 390. The optimum spaced relationship between the vertical cavity organic laser array 190 and the external pump beam light source 350 is maintained by use of adjusters 400a and 400b and adjusters 410a and 410b. The adjusters 400a, 400b, 410a, and 410b may be fine thread screws and are capable of moving the vertical cavity organic laser array 190 in the direction shown by arrows 420a, 420b, and 430a, 430b. The positioner 360 uses the reflector 380 and a light gathering mechanism 435 to direct the light rays 440 from the external pump beam light source 350 through the collimating optic 390 to the vertical cavity organic laser array 190. In the embodiment shown, the external pump beam light source 350 may be any incoherent light source. Alternatively, the external pump beam may originate from a coherent laser source, not shown, or the pump beam light source 230 as described in FIG. 4*a*.

Figure 7:
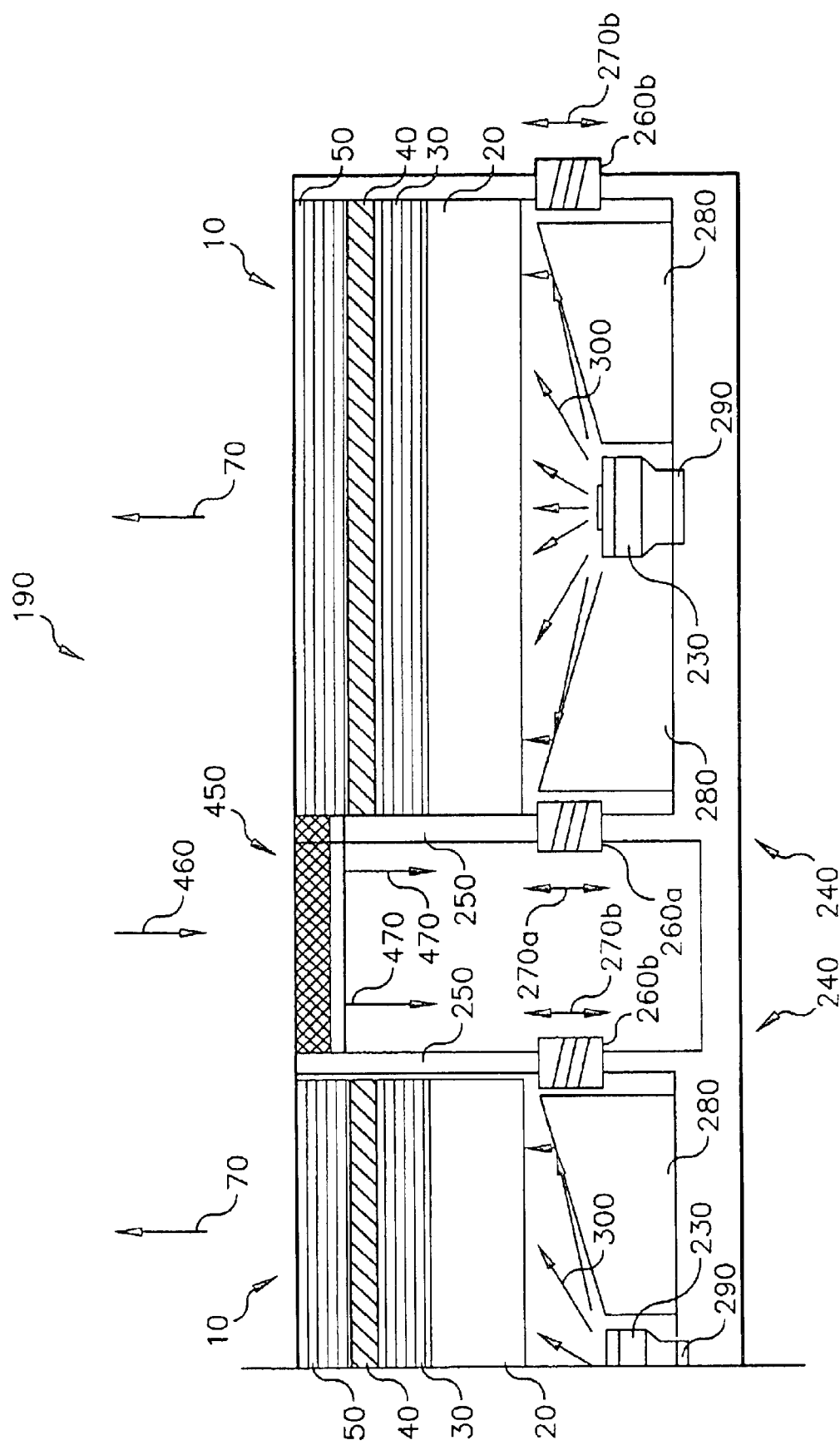
FIG. 7 is a schematic cross-section view of the vertical cavity organic laser array, positioner, and a sensor made in accordance with the present invention.
Figure 9A:
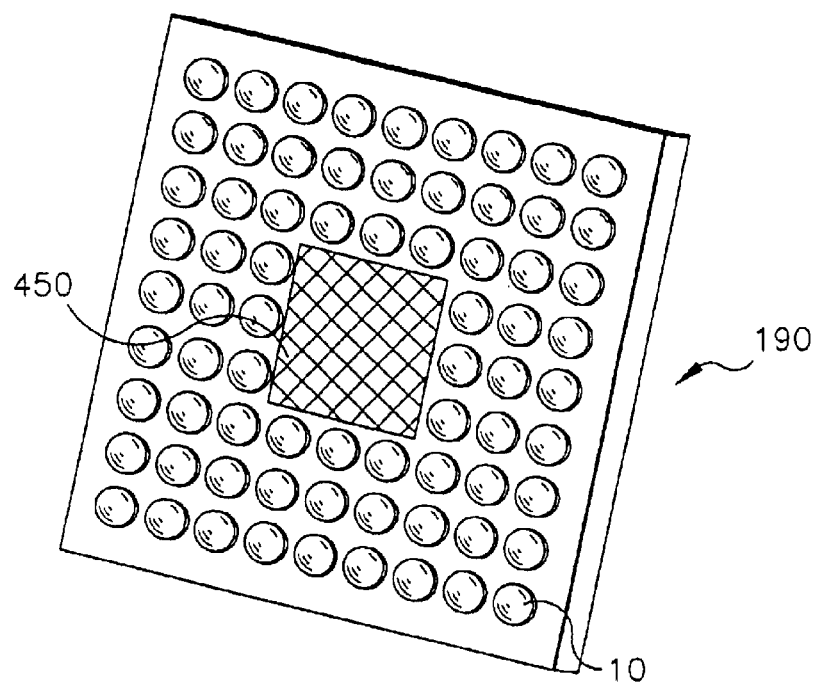
FIG. 9a is a top plan view of the vertical cavity organic laser array and a sensor made in accordance with the present invention.

FIG. 7 is schematic cross-section view of yet another embodiment of the present invention illustrating the vertical cavity organic laser array 190, comprising at least two vertical cavity organic laser devices 10 with a sensor 450 tuned to detect the laser emission 70 when it is reflected back from another surface not shown. As previously discussed in FIGS. 1 and 4*a*, like numerals indicate like parts and operations. The sensor 450 may be located in the center of the vertical cavity organic laser array 190 as shown in FIG. 9*a*. The sensor may be a photo-multiplier tube, an inorganic semi-conductor photovoltaic sensor, organic semiconductor photovoltaic sensor, an inorganic based photocurrent sensor, or an organic based photocurrent sensor. The vertical cavity organic laser array 190 illustrated in FIG. 7 and FIG. 9*a* is comprised of a plurality of vertical cavity organic laser devices 10, which are all tuned to the same wavelength. The previously described pump beam light source 230 optically pumps each vertical cavity organic laser device 10, causing the vertical cavity organic laser array 190 to laze, thereby creating laser emission 70 from the top dielectric stack 50. When the laser emission 70 strikes another surface, it (laser emission) is reflected back toward the vertical cavity organic laser array 190. The sensor 450 may be tuned to be sensitive to only the wavelength of the reflected light ray 460. The sensor 450 upon detecting the reflected light ray 460 sends a signal via lines 470 to a memory and control unit (not shown). The signal may be used to sound an alarm or cause another device to turn on or off, etc.

Figure 8:
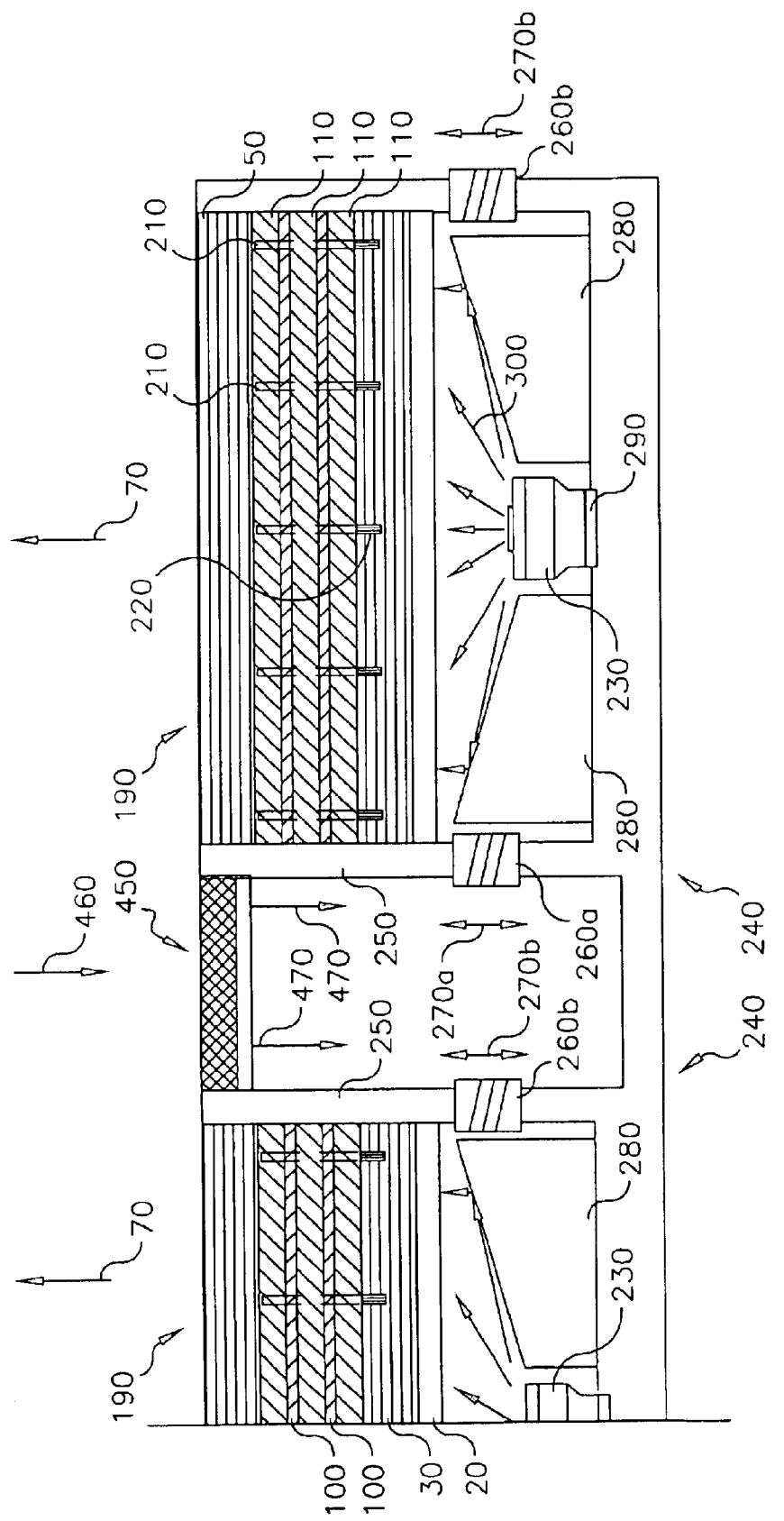
FIG. 8 is a schematic cross-section view of another embodiment of the present invention of the vertical cavity organic laser array, positioner, and a sensor made in accordance with the present invention.

FIG. 8 illustrates another embodiment of the present invention showing the sensor 450 located between two vertical cavity organic laser arrays 190; each vertical cavity organic laser array 190 having positioners 240 which maintain a spaced relationship between the vertical cavity organic laser array 190, sensor 450, and pump beam light source 230. As previously discussed, like numerals indicate like parts and operations. When the array lazes, creating the emission 70 and strikes another surface reflecting back toward the vertical cavity organic laser array 190, the sensor 450, tuned to be sensitive to only the wavelength of the reflected light ray 460, detects the reflected light ray 460, and sends a signal via lines 470 to the memory and control unit (not shown). The vertical cavity organic laser array 190 may be comprised of one or more vertical cavity organic laser devices 10 emitting a wavelength of visible light different from the wavelength of light being emitted from a neighboring vertical cavity organic laser device 10. Likewise, one or more sensors 450 located on the vertical cavity organic laser array 190 may be tuned to detect different wavelengths of emitted light. If more than one vertical cavity organic laser device 10 are combined into the vertical cavity organic laser array 190 and emits at the same wavelength, they become phase-locked, as previously described. However, the vertical cavity organic laser devices 10 do not have to emit at the same wavelength, but may be built to emit at different wavelengths.

The vertical cavity organic laser array 190 illustrated in FIG. 9*a* is comprised of a plurality of vertical cavity organic laser devices 10 tuned to the same wavelength and a sensor 450 tuned to detect the laser emission 70 when it is reflected back from another surface (not shown). The sensor 450 may be located in the center of the vertical cavity organic laser array 190, as shown in FIG. 9*a*, or elsewhere in the vertical cavity organic laser array 190. The sensor 450 may be a photo-multiplier tube, an inorganic semi-conductor photovoltaic sensor, organic semi-conductor photovoltaic sensor, an inorganic based photocurrent sensor, or an organic based photocurrent sensor.

Figure 9B:
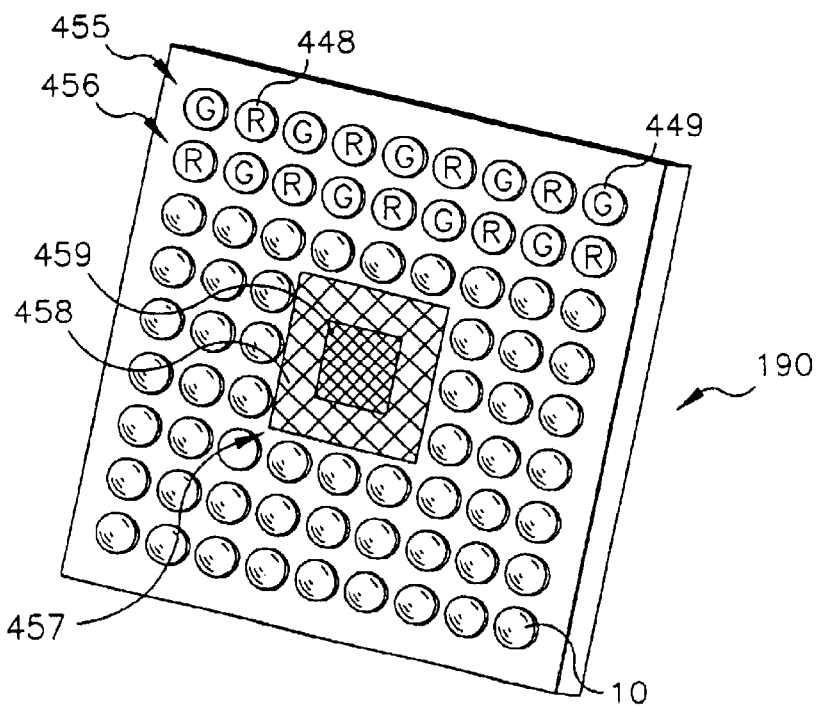
FIG. 9b is a top plan view of another embodiment of FIG. 9a made in accordance with the present invention.

The vertical cavity organic laser array 190 illustrated in FIG. 9*b* is comprised of vertical cavity lasers 448 and 449, which alternately are tuned to a wavelength in the red "R" and green "G," respectively, creating a G-R-G row 455 followed by a R-G-R row 456. The sensor array 457 located in the center of the vertical cavity organic laser array 190 is comprised of a sensing area 458, sensitive to the red wavelength, and a sensing area 459, sensitive to the green wavelength. Sensing areas 458 and 459 may be one or a combination of different types of sensors described above; sensitivity to specific wavelengths can also be controlled with color filters (not shown).

Figure 10:
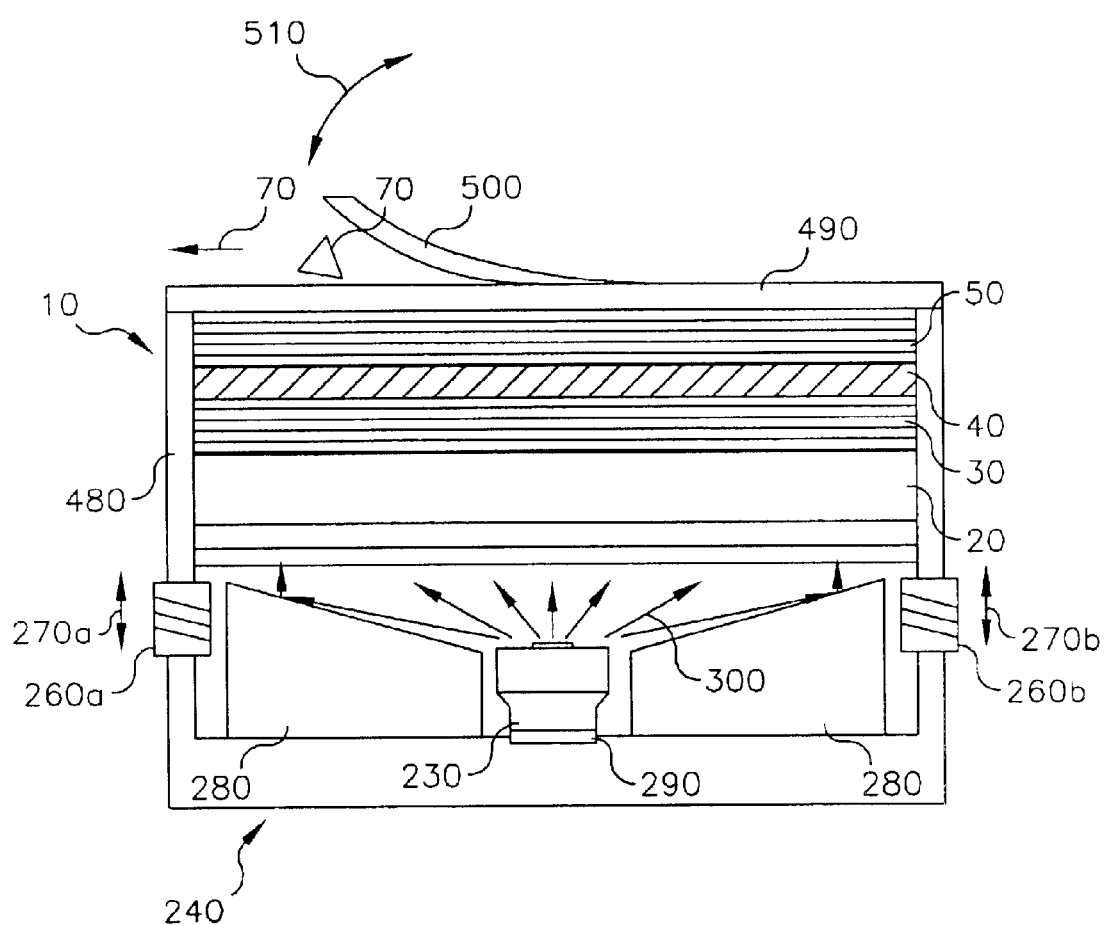
FIG. 10 is a schematic cross-section view of the vertical cavity organic laser, positioner, and a reflector made in accordance with the present invention.

FIG. 10 illustrates the vertical cavity organic laser device 10 and positioner 480 including a reflector assembly 490 made in accordance with the present invention. As previously discussed, like numerals indicate like parts and operations. The reflector assembly 490 holds a reflecting element 500 such as found in MEMS devices or the Texas Instrument Digital Micromirror Device™, which flexes in the directions indicated by arrow 510. The reflecting element 500 deflects laser emission 70 emitted from the vertical cavity organic laser device 10.

Figure 11:
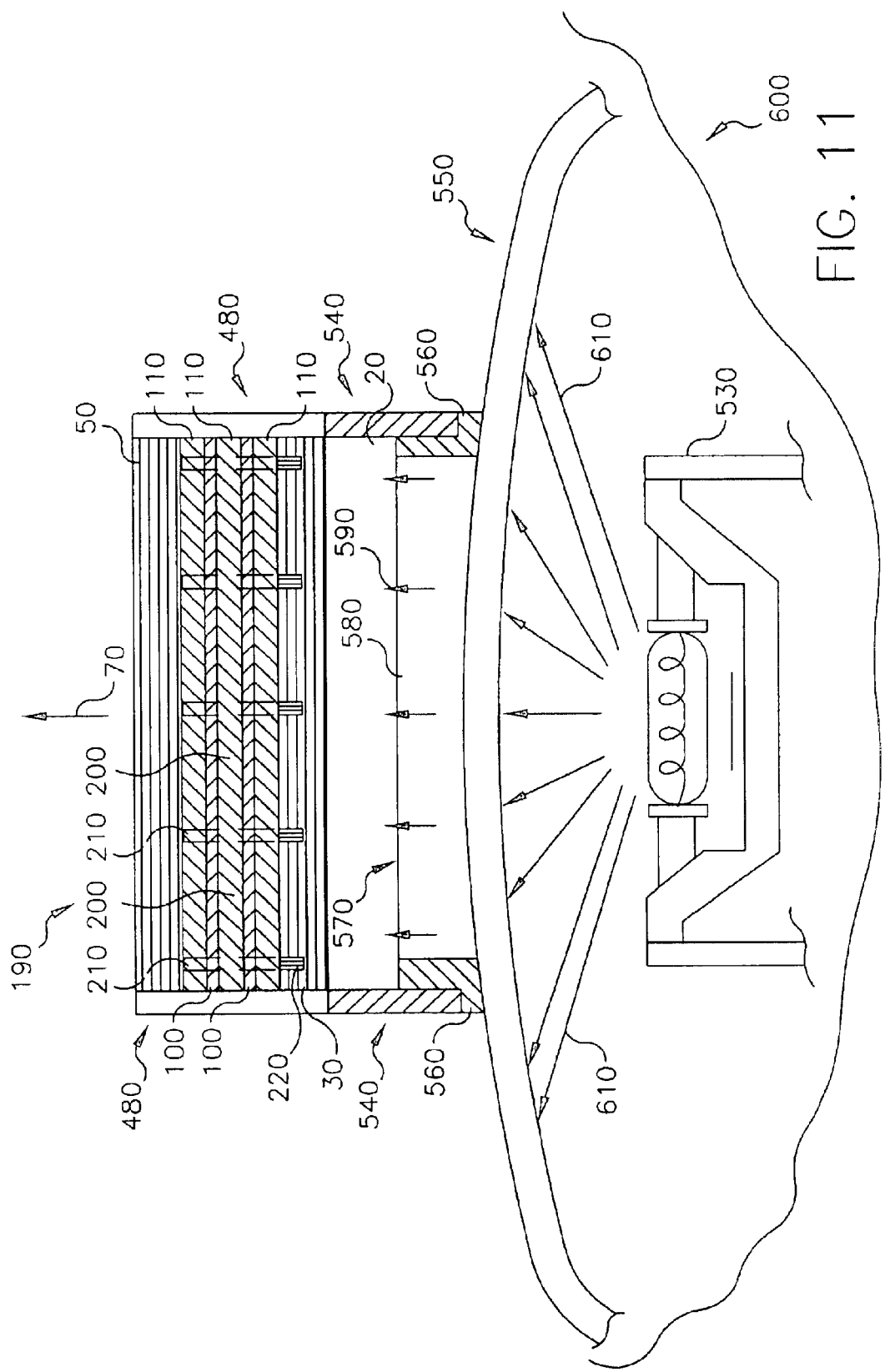
FIG. 11 is a schematic of the vertical cavity organic laser device attached to the external pump beam light source by a connector made in accordance with the present invention.

Referring to FIG. 11, the positioner 480 holds the vertical cavity organic laser array 190 in a spaced relationship to the external pump beam light source 530 via a connector 540, which provides a secure attachment to the outer surface 550 of the external pump beam light source 530. External pump beam light source 530 may be an automobile headlight, for example. As previously discussed in FIG. 3 like numerals indicate like parts and operations. A gasket ring 560 which creates a seal between the connector 540 and the outer surface 550 of the external pump beam light source 530, therein forming a receptacle 570 to hold an adhesive 580, such as OP29™ manufactured by the Dymax Corporation. The adhesive 580 acts as an optical refractive index matching medium. One should match index of the substrate 20 of the vertical cavity organic laser array 190 to the index of the external pump beam light source 530 so as to not degrade the light transfer properties. For example, the vertical cavity organic laser array 190 may be attached, as described above, to a headlight 600 of an automobile (shown in FIG. 11), which acts as the external pump beam light source 530 providing pump beam light 590 in the form of light rays 610. The connector 540 captures the pump beam light 590 directing it to the vertical cavity organic laser array 190. By attaching the vertical cavity organic laser array 190 in the center of the headlight 600 most of the light rays 610 are not captured by the connector 540 and provide normal driving light for the automobile. The vertical cavity organic laser array 190, using the connector 540, may be attached to any external pump beam light source 530 such as a flash light, search light, or light fixture, for example.

Figure 12:
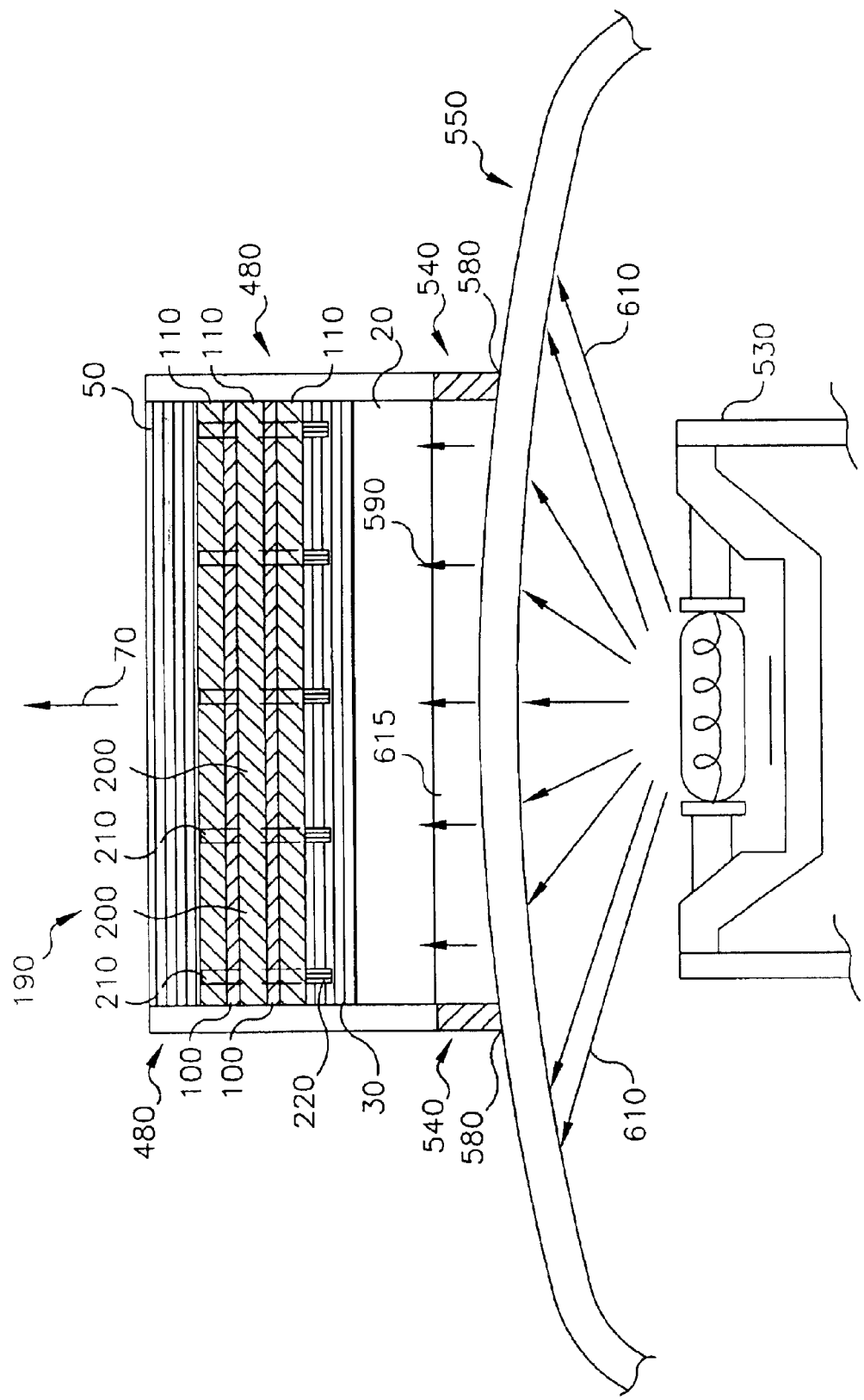
FIG. 12 is a schematic of still another embodiment made in accordance with the present invention.

In another embodiment of the present invention, shown in FIG. 12, the positioner 480 holds the vertical cavity organic laser array 190 in a spaced relationship to the external pump beam light source 530 and a connector 540. The connector 540 provides a secure attachment to the outer surface 550 of the external pump beam light source 530 by means of a collimating optic 615. As previously discussed in FIG. 11, like numerals indicate like parts and operations. Attachment is achieved by mounting the collimating optic 615 directly to the external pump beam light source 530, using the adhesive 580 described above. In the embodiment described herein, the adhesive 580 is applied directly between the bottom surface 618 of the collimating optic 615 and the outer surface 550 of the external pump beam light source 530. The connector 540 captures the pump beam light 590 and directs it to the vertical cavity organic laser array 190.

Figure 13:
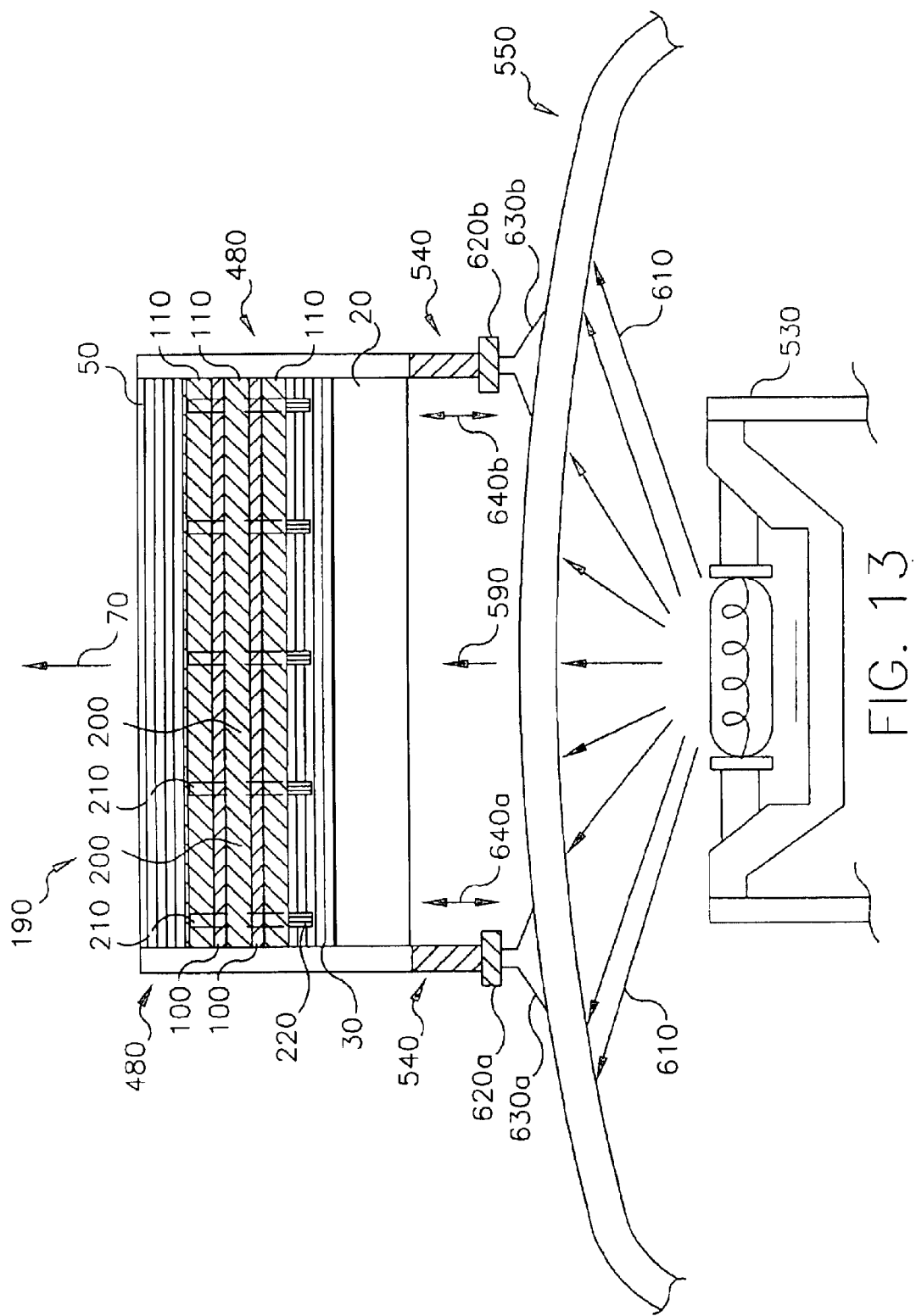
FIG. 13 is a schematic of still another embodiment made in accordance with the present invention.

In still another embodiment of the present invention, shown in FIG. 13, the positioner 480 uses the connector 540 equipped with adjusters 620a and 620b, suction cup feet 630a and 630b, respectively, to attach to the outer surface 550 of the external pump beam light source 530. Again, the positioner 480 holds the vertical cavity organic laser array 190 in a spaced relationship to the external pump beam light source 530. The adjusters 620a and 620b are used to maintain the optimum spaced relationship between the vertical cavity organic laser array 190 and the external pump beam light source 530. The adjusters 620a and 620b may be very fine thread screws and are capable of moving the vertical cavity organic laser array 190 in the direction shown by arrows 640a and 640b. The connector 540 captures a portion of the light rays 440 and directs the pump beam light 590 to the vertical cavity organic laser array 190.

Figure 14:
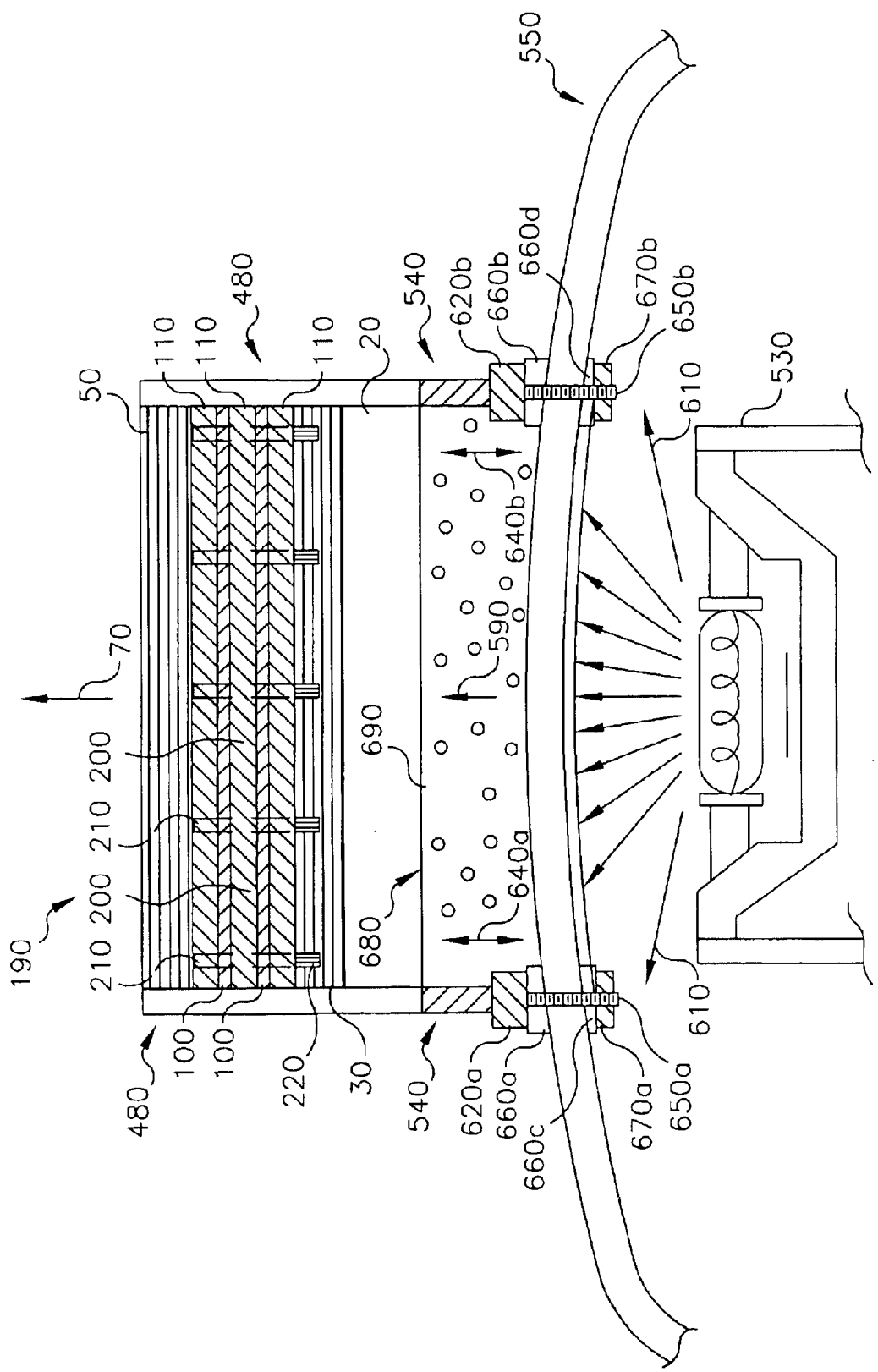
FIG. 14 is a schematic of yet another embodiment made in accordance with the present invention.

In yet another embodiment of the present invention, shown in FIG. 14, the positioner 480, using the connector 540, is attached directly to the outer surface 550 of the external pump beam light source 530 and holds the vertical cavity organic laser array 190 in a spaced relationship to the external pump beam light source 530. The connector 540 equipped with threaded rods 650a and 650b, having upper gaskets 660a, 660b and lower gaskets 660c and 660d respectively, attaches to the outer surface 550 of the external pump beam light source 530 via threaded rods 650a, 650b and nuts 670a, 670b. The gaskets 660a, 660b, 660c, and 660d form a reservoir 680 which may be used to hold an optical refractive index matching medium 690 such as Cargille™ Refractive Index Liquids, Series A (certified), which matches the index of refraction of the outer surface 550 material and the substrate 20 of the vertical cavity organic laser array 190. For example, where the substrate 20 is glass and the outer surface 550 is glass, a reasonable index of refraction of the liquid would be in the range of about 1.5 to about 1.6. The adjusters 620a and 620b are used to maintain the optimum spaced relationship between the vertical cavity organic laser array 190 and the external pump beam light source 530. The adjusters 620a and 620b may be very fine thread screws and are capable of moving the vertical cavity organic laser array 190 in the direction shown by arrows 640a and 640b. The connector 540 captures a portion of the light rays 440 and directs the pump beam light 590 to the vertical cavity organic laser array 190.

Figure 15:
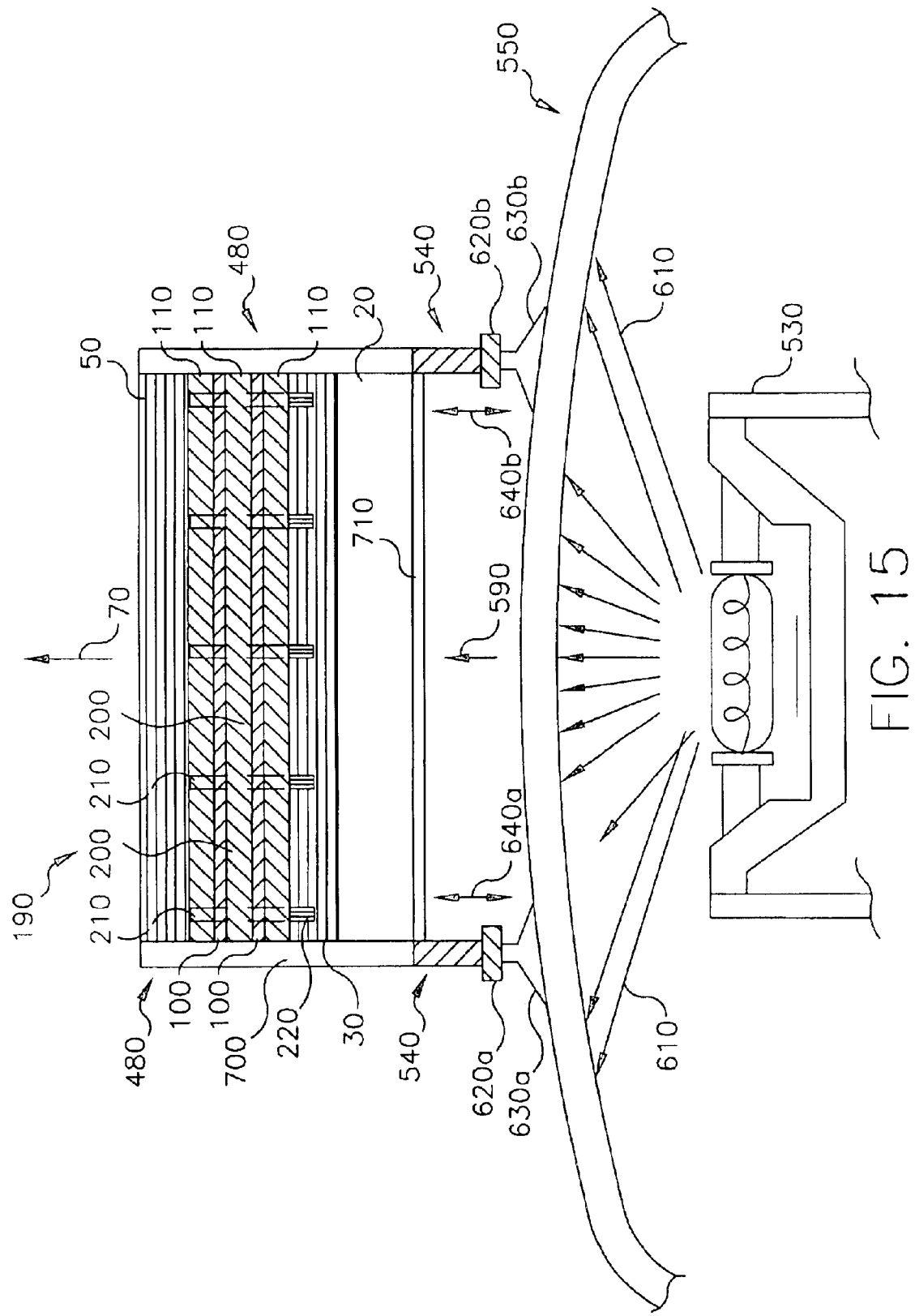
FIG. 15 is a schematic cross-section view of the vertical cavity organic laser device with the positioner and spectral modifying medium made in accordance with the present invention.

FIG. 15 illustrates a cross-sectional view of the vertical cavity organic laser array 190 and external pump beam light source 530 held in place by a positioner 480. In one embodiment, the positioner framework 700 holds the spaced relationship between the external pump beam light source 530 and the vertical cavity organic laser array 190 and also a spectral modifying medium 710. As previously discussed in FIG. 13, like numerals indicate like parts and operations. The spectral modifying medium 710 may be a specific type of filter such as Wratten 98™ which transmits predominately blue light. Moreover, the spectral modifying medium 710 may have a neutral density and modify the intensity of the laser emission 70 by increasing the amount of pump beam light 590 directed at the vertical cavity organic laser array 190. The amount the intensity of the laser emission 70 is modified corresponds to the density of the spectral modifying medium 710. The embodiment illustrated in FIG. 15 shows the vertical cavity organic laser array 190. It is understood that the positioner framework 700 may also hold the single vertical cavity organic laser device 10 shown in FIG. 4a.

The invention has been described with reference to a preferred embodiment; however, it will be appreciated that variations and modifications can be effected by a person of ordinary skill in the art without departing from the scope of the invention.

PARTS LIST:

10 vertical cavity organic laser device
20 substrate
30 bottom dielectric stack
40 organic active region
50 top dielectric stack
60 pump beam
70 laser emission
80 vertical cavity organic laser device
100 periodic gain regions
103 antinodes
105 electromagnetic field nodes
110 organic spacer layers
120 electromagnetic field pattern
190 vertical cavity organic laser array
200 organic laser cavity device
210 inter-pixel regions
211 circular pillars
220 etched regions
230 pump beam light source
230 positioner
250 framework
260a, 260b adjuster
270a, 270b arrow
280 pump beam light cone
290 pump beam light source holder
300 light rays
305 second harmonic frequency generator
308 sum or difference frequency generator
310 positioner
315 second vertical cavity organic laser device
320 framework
330 pump beam light cone
340 holder
350 external pump beam light source
360 positioner
370 framework
380 reflector
390 collimating optic
400a, 400b adjuster
410a, 410b adjuster
420a, 420b arrow
430a, 430b arrow
435 light gathering mechanism
440 light rays
448 red vertical cavity laser
449 green vertical cavity laser
450 sensor
455 G-R-G row
456 R-G-R row
457 sensor array
458 sensing area
459 sensing area
460 reflected light ray
470 lines
480 positioner
490 reflector assembly
500 reflecting element
510 arrow
530 external pump beam light source
540 connector 550 outer surface
560 gasket ring
570 receptacle
580 adhesive
590 pump beam light
600 headlight
610 light rays
615 collimating optic
618 bottom surface
620a, 620b adjuster
630a, 630b suction cup feet
640a, 640b arrow
650a, 650b threaded rods
660a, 660b upper gasket
660c, 660d lower gasket
670a, 670b nut
680 reservoir
690 optical refractive index matching medium
700 framework
710 spectral modifying medium

What is claimed is:

1. A vertical cavity organic laser device having a substantially low threshold for optical excitation, wherein the optical excitation occurs below 0.1 W/cm$^2$ power density, comprising:
   a) an organic laser cavity and having a substantially low threshold for optical excitation including:
      a1) a bottom dielectric stack for receiving and transmitting pump beam light and being reflective to laser light over a predetermined range of wavelengths;
      a2) an organic active region for receiving transmitted pump beam light from the first dielectric stack and for emitting the laser light; and
      a3) a top dielectric stack for reflecting transmitted pump beam light and the laser light from the organic active region back into the organic active region, wherein a combination of the bottom and the top dielectric stacks and the organic active region produces the laser light;
   b) an external pump beam light source for optically pumping light to the organic laser cavity having a substantially low threshold for optical excitation; and
   c) a positioner for holding and/or adjusting the organic laser cavity having a substantially low threshold for optical excitation in a spaced relationship to the external pump beam light source.

2. The vertical cavity organic laser device according to claim 1, wherein the output of the vertical cavity organic laser device is one specific wavelength of light.

3. The vertical cavity organic laser device according to claim 2, further comprising:
   d) a sensor for sensing the one specific wavelength of light.

4. The vertical cavity organic laser device according to claim 1, further comprising:
   d) an optical element for directing the light from the external pump beam light source to the organic laser cavity.

5. The vertical cavity organic laser device according to claim 1, wherein the output of the vertical cavity organic laser device having been one specific wavelength of light is dynamically shifted to another specific wavelength of light by way of a means for changing frequency of input laser light.

6. The vertical cavity organic laser device according to claim 1, wherein the positioner includes a connector such that the external pump beam light source connects to the organic laser cavity.

7. The vertical cavity organic laser device according to claim 6, wherein the connector fixedly connects the external pump beam light source to the organic laser cavity while providing an interface for containing an optical refractive index matching medium.

8. The vertical cavity organic laser device according to claim 6, wherein the connector fixedly connects the external pump beam light source to the organic laser cavity.

9. The vertical cavity organic laser device according to claim 7, wherein the connector has an optical refractive index matching medium with adhesive properties.

10. The vertical cavity organic laser device according to claim 6, wherein the connector fixedly connects the external pump beam light source to the organic laser cavity while providing a chamber for containing an optical refractive index matching medium.

11. At least two vertical cavity organic laser devices each having a substantially low threshold for optical excitation, wherein the optical excitation occurs below 0.1 W/cm$^2$ power density, comprising:
   a) an organic laser cavity, having a substantially low threshold for optical excitation, for each of the at least two vertical cavity organic laser devices including:
      a1) a bottom dielectric stack for receiving and transmitting pump beam light and being reflective to laser light over a predetermined range of wavelengths for each of the at least two vertical cavity organic laser devices;
      a2) an organic active region for receiving transmitted pump beam light from the bottom dielectric stack for each of the at least two vertical cavity organic laser devices and for emitting the laser light; and
      a3) a top dielectric stack for reflecting transmitted pump beam light and laser light from the organic active region back into the organic active region, wherein a combination of the bottom and top dielectric stacks and the organic active region produces the laser light for each of the at least two vertical cavity organic laser devices;
   b) an external pump beam light source for optically pumping light to each of the at least two vertical cavity organic laser devices at a substantially low threshold for optical excitation; and
   c) a positioner for holding and/or adjusting each of the at least two vertical cavity organic laser devices, having a substantially low threshold for optical excitation, in a spaced relationship to the external pump beam light source.

12. The at least two vertical cavity organic laser devices claimed in claim 11, wherein the at least two vertical cavity organic laser devices are arranged in a pattern.

13. The at least two vertical cavity organic laser devices claimed in claim 11, wherein the output of the at least two vertical cavity organic laser devices is one specific wavelength of light.

14. The at least two vertical cavity organic laser devices claimed in claim 11, wherein the output of the at least two vertical cavity organic laser devices are a plurality of specific wavelengths of light.

15. The at least two vertical cavity organic laser devices claimed in claim 11, further comprising:
   d) at least one sensor for sensing the one specific wavelength of light.

16. The at least two vertical cavity organic laser devices claimed in claim 14, further comprising:

d) at least one sensor for sensing the plurality of specific wavelengths of light.

17. The at least two vertical cavity organic laser devices claimed in claim 11, further comprising:
   d) an optical element for directing the light from the external pump beam light source to each of the at least two vertical cavity organic laser devices.

18. The at least two vertical cavity organic laser devices claimed in claim 11, wherein the output of the at least two vertical cavity organic laser devices having been one specific wavelength of light is dynamically shifted to another specific wavelength of light.

19. The at least two vertical cavity organic laser devices claimed in claim 11, wherein the positioner includes a connector such that the external pump beam light source connects to the at least two vertical cavity organic laser devices.

20. The at least two vertical cavity organic laser devices claimed in claim 19, wherein the connector fixedly connects the external pump beam light source to the at least two vertical cavity organic laser devices while providing an interface for containing an optical refractive index matching medium.

21. The at least two vertical cavity organic laser devices claimed in claim 19, wherein the connector fixedly connects the external pump beam light source to the at least two vertical cavity organic laser devices.

22. The at least two vertical cavity organic laser devices claimed in claim 20, wherein the connector has an optical refractive index matching medium with adhesive properties.

23. The at least two vertical cavity organic laser devices claimed in claim 20, wherein the connector fixedly connects the external pump beam light source to the at least two vertical cavity organic laser devices while providing a chamber for containing the optical refractive index matching medium.

24. The vertical cavity organic laser device claimed in claim 1, wherein the positioner includes a spectral modifying medium.

25. The at least two vertical cavity organic laser devices claimed in claim 11, wherein the positioner includes a spectral modifying medium.

26. The vertical cavity organic laser device claimed in claim 4, wherein the optical element for directing light includes a light gathering mechanism.

27. The at least two vertical cavity organic laser devices claimed in claim 17, wherein the optical element for directing light includes a light gathering mechanism.

28. The vertical cavity organic laser device according to claim 1, wherein the vertical cavity organic laser device is inverted so that the vertical cavity organic laser device is optically pumped through the top dielectric stack and the laser light is reflected from the bottom dielectric stack and emitted through the top dielectric stack.

29. The vertical cavity organic laser device according to claim 3, wherein the sensor is a photo-multiplier tube.

30. The vertical cavity organic laser device according to claim 3, wherein the sensor is an inorganic semi-conductor photo-voltaic sensor.

31. The vertical cavity organic laser device according to claim 3, wherein the sensor is an organic semi-conductor photo-voltaic sensor.

32. The vertical cavity organic laser device according to claim 3, wherein the sensor is an inorganic based photo-current sensor.

33. The vertical cavity organic laser device according to claim 3, wherein the sensor is an organic based photo-current sensor.

34. The at least two vertical cavity organic laser devices according to claim 15, wherein the at least one sensor is a photo-multiplier tube.

35. The at least two vertical organic laser cavity devices according to claim 15, wherein the at least one sensor is an inorganic semi-conductor photo-voltaic sensor.

36. The at least two vertical cavity organic laser devices according to claim 15, wherein the at least one sensor is an organic semi-conductor photo-voltaic sensor.

37. The at least two vertical cavity organic laser devices according to claim 15, wherein the at least one sensor is an inorganic based photo-current sensor.

38. The at least two vertical cavity organic laser devices according to claim 15, wherein the at least one sensor is an organic based photo-current sensor.

* * * * *